(12) United States Patent
Jeong et al.

(10) Patent No.: US 10,897,002 B2
(45) Date of Patent: Jan. 19, 2021

(54) ACOUSTIC RESONATOR AND METHOD OF MANUFACTURING THE SAME

(71) Applicant: Samsung Electro-Mechanics Co., Ltd., Suwon-si (KR)

(72) Inventors: Dae Hun Jeong, Suwon-si (KR); Sang Uk Son, Suwon-si (KR); Tae Yoon Kim, Suwon-si (KR); Dae Ho Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 479 days.

(21) Appl. No.: 15/824,194

(22) Filed: Nov. 28, 2017

(65) Prior Publication Data
US 2018/0277735 A1    Sep. 27, 2018

(30) Foreign Application Priority Data

Mar. 23, 2017    (KR) .................. 10-2017-0036659

(51) Int. Cl.
| H01L 41/047 | (2006.01) |
| H03H 9/02 | (2006.01) |
| H01L 41/22 | (2013.01) |
| H03H 3/02 | (2006.01) |
| H03H 9/17 | (2006.01) |
| H03H 9/54 | (2006.01) |
| H01L 41/187 | (2006.01) |

(52) U.S. Cl.
CPC ............ *H01L 41/047* (2013.01); *H01L 41/22* (2013.01); *H03H 3/02* (2013.01); *H03H 9/02118* (2013.01); *H03H 9/174* (2013.01); *H01L 41/187* (2013.01); *H03H 9/54* (2013.01); *H03H 2003/023* (2013.01)

(58) Field of Classification Search
CPC .. H01L 41/047; H03H 9/02118; H03H 9/174; H03H 3/02; H03H 9/02007
USPC .................................................. 310/320, 321
See application file for complete search history.

(56) References Cited

U.S. PATENT DOCUMENTS

| 2005/0248232 A1* | 11/2005 | Itaya ....................... H03H 9/174 |
| | | 310/320 |
| 2011/0298564 A1 | 12/2011 | Iwashita et al. |
| 2013/0314177 A1 | 11/2013 | Burak et al. |
| 2014/0118087 A1 | 5/2014 | Burak et al. |

\* cited by examiner

*Primary Examiner* — Derek J Roseneau
(74) *Attorney, Agent, or Firm* — NSIP Law

(57) ABSTRACT

An acoustic resonator includes a resonant portion including a piezoelectric layer disposed between a first electrode and a second electrode, and a frame portion disposed along an outer edge of the second electrode. The frame portion includes three reflective portions reflecting lateral waves generated in the resonant portion.

12 Claims, 4 Drawing Sheets

ACOUSTIC RESONATOR AND METHOD OF MANUFACTURING THE SAME

CROSS-REFERENCE TO RELATED APPLICATION(S)

This application claims benefit under 35 USC 119(a) of priority to Korean Patent Application No. 10-2017-0036659 filed on Mar. 23, 2017 in the Korean Intellectual Property Office, the disclosure of which is incorporated herein by reference in its entirety.

BACKGROUND

1. Field

The following description relates to an acoustic resonator and a method of manufacturing the same.

2. Description of Related Art

Band pass filters are key components of communications devices. The band pass filters select, receive, and transmit signals of required frequency bands, among a plurality of frequencies.

Typical examples of such band-pass filters include surface acoustic wave (SAW) filters, bulk acoustic wave (BAW) filters, and other similar filters.

In such typical examples of band-bass filters, bulk acoustic wave filters are obtained by implementing thin film-type devices, in which resonance is induced by depositing a piezoelectric dielectric material on silicon wafers provided as semiconductor substrates. Piezoelectric characteristics of the dielectric material are used to enable the band-pass filters to function as filters.

As the fields of applications thereof, mobile communications devices, small and lightweight filters such as chemical and biological devices, oscillators, resonant elements, and acoustic resonant mass sensors are provided.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples provide an acoustic resonator in which a loss ratio of generated lateral waves is lowered, and a method of manufacturing the same.

In accordance with an example, there is provided an acoustic resonator, including: a resonant portion including a piezoelectric layer disposed between a first electrode and a second electrode; and a frame portion disposed along an outer edge of the second electrode, wherein the frame portion includes three reflective portions reflecting lateral waves generated in the resonant portion.

The frame portion may include: an internal frame configured to be spaced apart from the second electrode by a predetermined distance, and disposed on the piezoelectric layer along an outer edge of the second electrode; and an external frame continuously disposed with the second electrode, and disposed on the piezoelectric layer to embed the internal frame in the external frame.

The external frame may be formed of a same material as a material of an edge portion of the second electrode continuously formed with the edge portion of the second electrode.

The external frame may be configured to have a thickness greater than a thickness of the second electrode.

The external frame may be configured to include an inclined surface.

The internal frame may be formed of a dielectric material.

The internal frame may be formed of the same material as a material of the external frame.

The acoustic resonator may also include: a protective layer disposed on the second electrode and the frame portion.

The acoustic resonator may also include: a connection electrode may include one end connected to the second electrode via the frame portion and another end connected to an external electrode, the connection electrode having a thickness less than a thickness of the frame portion.

The acoustic resonator may also include: a connection electrode, wherein the first electrode and the second electrode may be connected to a portion of the connection electrode that extends outwardly of the piezoelectric layer, to be connected to a connection part and an external electrode.

The reflective portions are configured as regions having different thicknesses or as regions may have different lamination structures or material composition.

A first reflective portion of the three reflective portions closest to the second electrode and a third reflective portion of the three reflective portions farthest from the second electrode may be formed to have a same lamination structure and a same thickness as each other.

A second reflective portion disposed between the first reflective portion and the third reflective portion may include a lamination structure and a thickness different from thicknesses of the first reflective portion and the third reflective portion.

In accordance with an example, there is provided a method of manufacturing an acoustic resonator, including: sequentially laminating a first electrode and a piezoelectric layer on a substrate; forming an internal frame on the piezoelectric layer; and forming a second electrode and an external frame on the piezoelectric layer, wherein the external frame is formed to embed the internal frame, formed along an outer edge of the second electrode, in the external frame, and is formed to include three reflective portions reflecting lateral waves generated in a resonant portion formed by the first electrode, the piezoelectric layer, and the second electrode.

The forming a second electrode and an external frame may include: forming a conductive layer including a uniform thickness on an upper region of the piezoelectric layer, including a region in which the internal frame is formed; and partially etching the conductive layer to form the second electrode having a thickness less than a thickness of the external frame.

The forming a second electrode and an external frame may include: forming a primary conductive layer on an upper region of the piezoelectric layer on which the internal frame is formed to embed the internal frame in the primary conductive layer; and forming a secondary conductive layer having a uniform thickness on an upper region of the piezoelectric layer, including a region in which the primary conductive layer is formed.

In the forming of the external frame may include embedding the internal frame in the external frame to have an inclined surface.

The method may also include: forming a first reflective portion of the three reflective portions closest to the second electrode and a third reflective portion of the three reflective portions farthest from the second electrode to include a same lamination structure and a same thickness as each other.

The method may also include: forming a second reflective portion between the first reflective portion and the third reflective portion to include a lamination structure and a thickness different from thicknesses of the first reflective portion and the third reflective portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
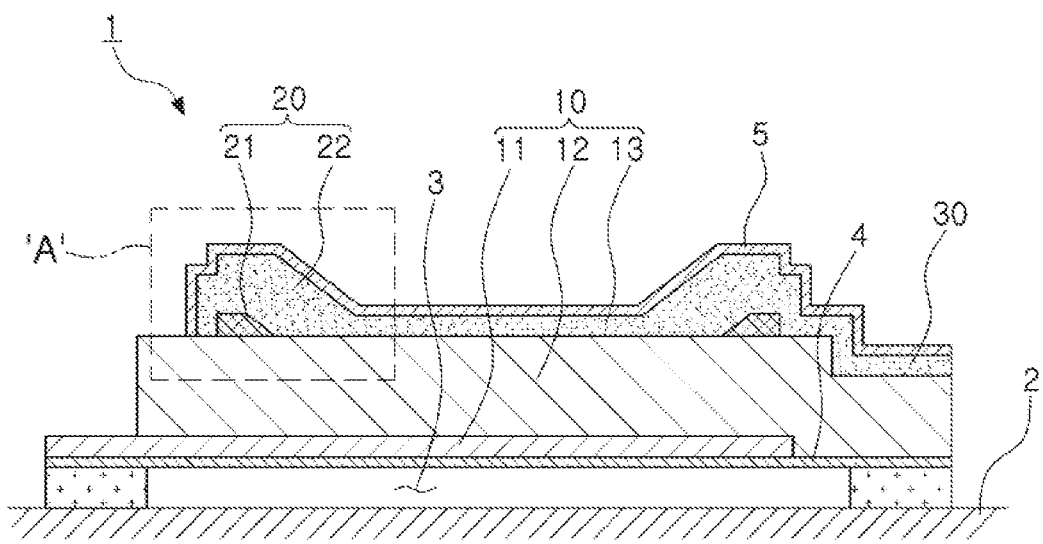
FIG. 1 is a schematic cross-sectional view of an acoustic resonator, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Subsequently, examples are described in further detail with reference to the accompanying drawings.

FIG. 1 is a schematic cross-sectional view of an acoustic resonator, according to an example. An acoustic resonator 1, according to an example, is provided for a bulk acoustic wave (BAW) filter among band-pass filters. However, the acoustic resonator 1 may be provided to other types of filters. The acoustic resonator 1 includes a frame portion 20 to prevent a lateral wave from escaping from a resonant portion 10, among acoustic waves generated in the resonant portion 10.

For example, the acoustic resonator 1 includes the frame portion 20, to prevent energy loss due to a lateral wave escaping from the resonant portion 10, which would lead to deteriorations in performance of the acoustic resonator 1.

Normally, the acoustic resonator is configured and built to increase an efficiency of reduction in energy loss by increasing a width of a frame portion and reflect a lateral wave inwardly; however, as a result of such configuration, parasitic capacitance increases reducing a coupling constant.

Thus, the acoustic resonator 1, according to an example, is configured to include at least three reflective portions 20a, 20b and 20c to increase reflection efficiency of a lateral wave without increasing a width of the frame portion 20.

In other words, the acoustic resonator 1, according to an example, is configured to include the resonant portion 10 in which a piezoelectric layer 12 is disposed or provided on a first electrode 11, and a second electrode 13 is disposed or provided on the piezoelectric layer 12. The frame portion 20 is disposed or provided along an outer edge, outer surface, a surface opposite to the piezoelectric layer 12, or an upper surface of the second electrode 13. The frame portion 20 is configured to include at least three reflective portions 20a, 20b and 20c reflecting lateral waves generated in the resonant portion 10.

As an example, the reflective portions 20a, 20b and 20c are configured as regions having different thicknesses or as regions having different lamination structures or material composition to be distinguishable from each other.

Thus, the frame portion 20 effectively reduces energy loss by increasing reflection efficiency of the lateral wave, while lowering a rate of parasitic capacitance formation by.

However, the structure that forms a region divided into the reflective portions 20a, 20b and 20c, are not limited to that of the example described above. For example, any structure configured to reflect the lateral wave may be used as the reflective portions 20a, 20b and 20c according to an example.

Figure 2:
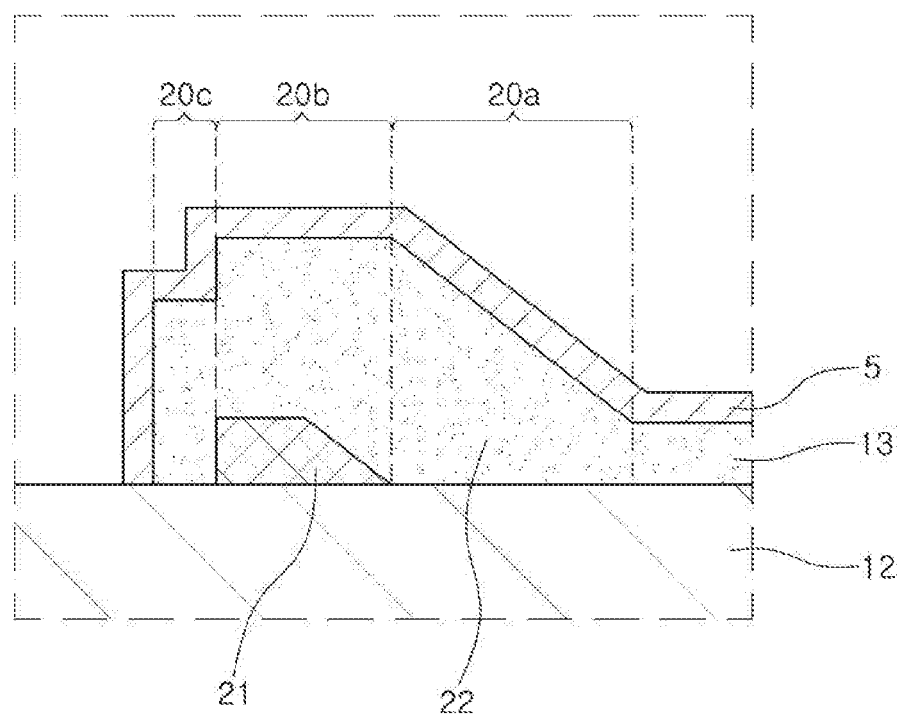
FIG. 2 is an enlarged cross-sectional view of portion A of FIG. 1.

FIG. 2 is an enlarged cross-sectional view of part A of FIG. 1. Referring to FIGS. 1 and 2, the acoustic resonator 1 includes the resonant portion 10 and the frame portion 20.

In further detail, in examples of filters using the acoustic resonator 1 such as a bulk acoustic wave (BAW), in an example, when a quality factor (QF) of the acoustic resonator 1 is improved, the filters have improved characteristics to only select a required frequency band and improved insertion loss and attenuation performance.

In order to improve the quality factor of the acoustic resonator 1, the frame portion 20 is configured such that resonance energy may be confined in an active area of the resonator.

For example, the frame portion 20 is formed on a circumference or on an upper surface of the acoustic resonator 1 to prevent loss of resonance energy, thereby preventing deteriorations of the quality factor of the acoustic resonator 1.

As such, as the frame portion 20 is formed in a continuous shape or manner to seal the second electrode 13 of the resonant portion 10, loss of an acoustic wave is reduced. For example, by blocking paths along which the acoustic wave may escape in all directions on an electrode surface of the resonant portion 10, loss of acoustic waves is reduced.

In addition, the frame portion 20 includes at least three reflective portions 20a, 20b and 20c reflecting lateral waves to enhance an effect of preventing loss of resonance energy. On the other hand, the first and the second electrodes 11 and 13 provided in the resonant portion 10 may be provided with a connection electrode 30 for a connection thereof to an external electrode.

For example, the acoustic resonator 1, according to an example, includes the connection electrode 30. One end of the connection electrode 30 is electrically connected to the second electrode 13 via the frame portion 20, and another end of the connection electrode 30 is connected to an external electrode. In addition, the external electrode serves to apply a voltage to the resonant portion 10.

The resonant portion 10 is configured to generate an acoustic wave or vibration energy through vibrations. To this end, the resonant portion 10 includes the first electrode 11, the piezoelectric layer 12, and the second electrode 13.

In an example, a substrate 2 on which the resonant portion 10 is provided is formed as a silicon substrate or a high resistivity silicon (HRS)-type substrate.

An air gap 3 is formed between the substrate 2 and the first electrode 11. By providing the air gap 3, at least portions of the first electrode 11 and the substrate 2 are spaced apart from each other.

On the other hand, a membrane layer 4 is formed on one surface of the first electrode 11, opposite to the substrate 2.

In addition, by providing the air gap 3 between the resonant portion 10 and the substrate 2, reflection characteristics of acoustic waves generated in the resonant portion 10 are improved.

In other words, because the air gap 3 is an empty space and has impedance close to infinity, acoustic waves remain in the resonant portion 10 without loss or being lost due to the air gap 3.

Thus, longitudinal acoustic wave loss of the resonant portion 10 is significantly reduced through the air gap 3, thereby improving the quality factor (QF) of the resonant portion 10.

The first electrode 11, the second electrode 13 and the piezoelectric layer 12 included in the resonant portion 10 are formed by sequentially laminating the first electrode 11, the piezoelectric layer 12, and the second electrode 13 on the substrate 2. Thus, the piezoelectric layer 12 is disposed between the first electrode 11 and the second electrode 13.

The resonant portion 10 generates a resonant frequency and an anti-resonant frequency by resonating the piezoelectric layer 12 according to or based on signals applied to the first electrode 11 and the second electrode 13.

The first electrode 11 and the second electrode 13 may be formed of a metal, such as gold, molybdenum, ruthenium, aluminum, platinum, titanium, tungsten, palladium, chromium, nickel, iridium, and similar materials.

The resonant portion 10 uses acoustic waves of the piezoelectric layer 12. For example, in response to a signal being applied to the first electrode 11 and the second electrode 13, the piezoelectric layer 12 generates mechanical vibrations in a longitudinal direction or in a thickness direction, to generate acoustic waves.

In this case, the piezoelectric layer 12 may be formed of a material, such as zinc oxide (ZnO), aluminum nitride (AlN), doped zinc oxide, for example, W—ZnO, doped aluminum nitride, for example, Sc—AlN, MgZr—AlN, Cr—AlN, Er—AlN or Y—AlN, or similar materials.

A resonance phenomenon of the piezoelectric layer 12 occurs when half of an applied signal wavelength coincides with a thickness of the piezoelectric layer 12.

In addition, when the resonance phenomenon occurs, because electrical impedance changes abruptly, the acoustic resonator 1, according to an example, is configured as a filter enabled to select a frequency.

A resonant frequency is determined by a thickness of the piezoelectric layer 12 and an intrinsic acoustic wave velocity of the piezoelectric layer 12, and the first electrode 11 and the second electrode 13 surrounding the piezoelectric layer 12. For example, as a thickness of the piezoelectric layer 12 is further reduced, the resonant frequency increases.

On the other hand, for example, when the piezoelectric layer 12 is configured to be only or exclusively disposed within the resonant portion 10, leakage of acoustic waves formed by the piezoelectric layer 12 to the outside or exterior of the resonant portion 10 is significantly reduced.

The resonant portion 10 further includes a protective layer 5. The protective layer 5 covers the second electrode 13 such that the second electrode 13 is not exposed to an external environment. For example, the acoustic resonator 1 includes the protective layer 5 disposed on the second electrode 13 and the frame portion 20.

The first electrode 11 and the second electrode 13 are connected to at least a portion of the connection electrode 30 that extends outwardly of the piezoelectric layer 12, to be connected to a connection part and an external electrode.

In this example, the connection part is a configuration serving to apply and receive energy inducing vibrations and an electrical signal.

The frame portion 20 prevents acoustic waves generated in the resonant portion 10 from being lost.

In further detail, in order to prevent loss of acoustic waves generated in the resonant portion 10 in a lateral direction, the frame portion 20 reflects the acoustic waves.

For example, when the acoustic waves generated in the resonant portion 10 are transmitted to the frame portion 20, the frame portion 20 reflects the generated acoustic waves back to an interior of the resonant portion 10, thus, preventing a loss of acoustic waves.

To this end, the frame portion 20 is provided on at least one of the electrodes of the resonant portion 10. As an example, the frame portion 20 is disposed on the second electrode 13.

The frame portion 20 is disposed on the resonant portion 10 in a protruding shape, in such a manner that the frame portion reflects an acoustic wave generated in the resonant portion 10.

For example, the frame portion 20 has a protruding shape to be disposed in circumferentially to a region corresponding to the air gap 3 or disposed to surround the air gap 3.

As such, as the frame portion 20 is formed in a shape protruding from the resonant portion 10, the acoustic wave is reflected by the frame portion. For example, in a portion of the frame portion 20 that has a relatively great thickness, in a manner different from that of the second electrode 13, a propagation environment of the acoustic wave, such as an elastic wave, changes so that an acoustic wave is reflected by the frame portion.

In addition, as the frame portion 20 includes at least three reflective portions 20a, 20b and 20c reflecting lateral waves generated by the resonant portion 10, reflection efficiency of the lateral waves is increased.

In other words, because at least three reflective portions 20a, 20b 20c are included in the frame portion 20, the lateral waves may be reflected at least three times, such that reflection efficiency of the lateral wave may be increased without increasing a width of the frame portion 20.

Thus, the frame portion 20 is formed to have a multiframe structure including an internal frame 21 and an external frame 22, such that the frame portion 20 includes at least three reflective portions 20a, 20b and 20c.

For example, the frame portion 20 of the acoustic resonator 1 includes the internal frame 21 spaced apart from the second electrode 13 by a predetermined distance. The internal frame 21 is formed on the piezoelectric layer 12 along an outer edge of the second electrode 13. The frame portion 20 of the acoustic resonator 1 also includes the external frame 22 formed continuously with the second electrode 13 and disposed on the piezoelectric layer 12 in such a manner that the internal frame 21 is embedded therein.

In such a structure, the reflective portions 20a, 20b and 20c are distinguishable from each other by regions thereof having different thicknesses, and are also distinguishable from each other by regions thereof having different lamination structures, but are not limited thereto.

In one example, among three reflective portions, a first reflective portion closest to the second electrode 13 and a third reflective portion farthest from the second electrode 13 is formed to have the same lamination structure and the same thickness as each other, while a second reflective portion provided between the first reflective portion and the third reflective portion has a lamination structure and a thickness different from those of the first reflective portion and the third reflective portion.

In another example, three reflective portions 20a, 20b and 20c may have different lamination structures and thicknesses, illustrated in FIG. 2 by way of example.

The internal frame 21 is embedded in the external frame 22 once the external frame 22 is formed. Thus, the external frame 22 has at least three regions having different thicknesses, or has at least three regions having different lamination structures. The internal frame 21 is formed to protrude upwardly from the piezoelectric layer 12. The regions having different thicknesses or different lamination structures as described above become the reflective portions 20a, 20b and 20c reflecting lateral waves.

The external frame 22 is formed of the same material as that of the second electrode 13, such that the external frame 22 is formed together with formation of the second electrode 13. Thus, the external frame 22 is formed to be continuous with an edge of the second electrode 13.

In another example, even when the external frame 22 is formed continuously and the second electrode 13 is an edge of the external frame 22. The second electrode 13 is formed to have a thickness less than that of the external frame 22.

In addition, as the external frame 22 is formed to have an inclined surface, occurrence of cracks in the protective layer 5 in a process of covering the protective layer 5 on the second electrode 13 is prevented.

In other words, the external frame 22 of the acoustic resonator 1, according to an example, includes at least one inclined surface.

However, the external frame 22 does not always include an inclined surface, but is formed in a shape in which an upper surface and a side surface thereof are perpendicular to each other, according to various examples.

On the other hand, in order to reduce a rate of increase in parasitic capacitance by the frame portion 20, the internal frame 21 is formed of a dielectric material. For example, the internal frame 21 of the acoustic resonator 1, according to the example, is formed of a dielectric material.

In other words, when the internal frame 21 is formed of a dielectric material, a distance between the first electrode 11 and the external frame 22, forming parasitic capacitance, increases to reduce a ratio of parasitic capacitance generation.

In another example, the internal frame 21 of the acoustic resonator 1 is also formed of the same material as that of the external frame 22.

The connection electrode 30 serves to connect the electrode of the resonant portion 10 to an external electrode.

The connection electrode 30 connected to the second electrode 13 provided with the frame portion 20, in the electrodes of the resonant portion 10, is formed to have a thickness less than a thickness of the frame portion 20, to significantly reduce deteriorations in symmetry properties of the frame portion 20.

For example, the connection electrode 30 has a thickness less than that of the frame portion 20, to maintain the symmetry of the frame portion 20 related to transmission characteristics of acoustic waves.

Hereinafter, a method of manufacturing an acoustic resonator 1, according to an example will be described.

FIGS. 3 to 8 are cross-sectional views illustrating a method of manufacturing an acoustic resonator 1, according to an example. Referring to FIGS. 3 to 8, a method of manufacturing the acoustic resonator 1, according to an example, includes sequentially laminating a first electrode 11 and a piezoelectric layer 12 on a substrate 2, forming an internal frame 21 on the piezoelectric layer 12, and forming a second electrode 13 and an external frame 22 on the piezoelectric layer 12.

The external frame 22 is provided in such a manner that the internal frame 21 formed along an outer edge of the second electrode 13 is embedded therein, to thus have at least three reflective portions 20a, 20b and 20c.

Figure 3:
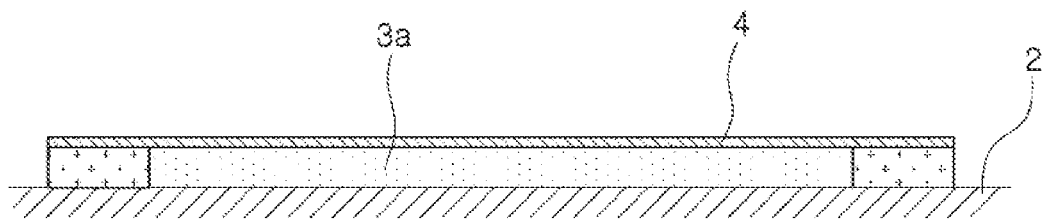
FIGS. 3 to 8 are cross-sectional views illustrating a method of manufacturing an acoustic resonator, according to an example.
Figure 4:
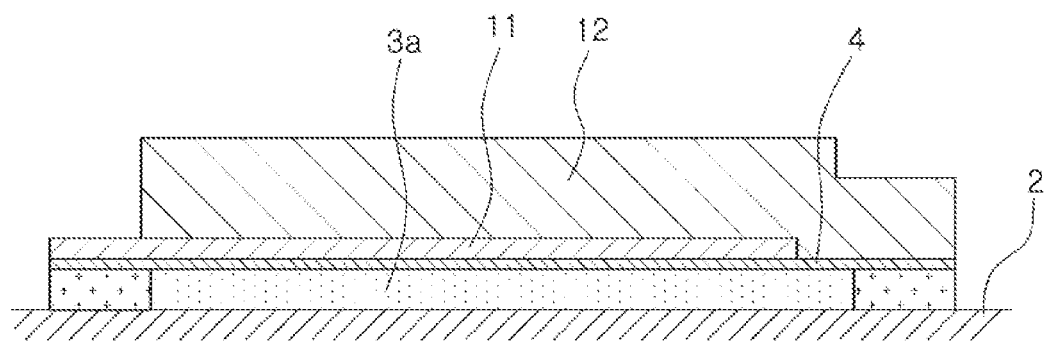

As illustrated in FIGS. 3 and 4, the first electrode 11 and the piezoelectric layer 12, among the first electrode 11, the piezoelectric layer 12, and the second electrode 13, are laminated.

FIG. 3 illustrates a state before the first electrode 11 and the piezoelectric layer 12 are laminated. A sacrificial layer 3a and a membrane layer 4 are first laminated on the substrate 2. In this example, a separate insulation layer (not shown), a protective layer separate from a protective layer 5 on the second electrode 13, is further provided between the membrane layer 4 and the sacrificial layer 3a.

FIG. 4 illustrates a state in which the first electrode 11 and the piezoelectric layer 12 are laminated after the sacrificial layer 3a and the membrane layer 4 are laminated.

As described above, in order to form an air gap 3 between the substrate 2 and the first electrode 11 of the resonant portion 10, the sacrificial layer 31 is formed between the substrate 2 and the first electrode 11. In this example, the sacrificial layer 3a is formed of silicon dioxide, polysilicon, a polymer, or the like. The sacrificial layer 3a is removed by an etching process to form the air gap 3.

The first electrode 11 is formed by depositing a conductive layer, a conductive layer (not shown) separate from a conductive layer 13a to form the second electrode 13 on the substrate 2 including the sacrificial layer 3a. In a manner similar thereto, the piezoelectric layer 12 is formed by depositing a piezoelectric material on the first electrode 11.

The first electrode 11 may be formed using various metals, such as molybdenum (Mo), gold, ruthenium, aluminum, platinum, titanium, tungsten, palladium, chromium, nickel, iridium, and the like.

The piezoelectric layer 12 may be formed using various piezoelectric materials, such as aluminum nitride (AlN), zinc oxide (ZnO), doped zinc oxide, for example, W—ZnO, doped aluminum nitride, for example, Sc—AlN, MgZr—AlN, Cr—AlN, Er—AlN, Y—AlN, or the like.

In this example, the first electrode 11 and the piezoelectric layer 12 are formed using required patterns obtained by performing patterning via a photolithography process and then removing unnecessary portions using patterned photoresist as a mask.

Figure 5:
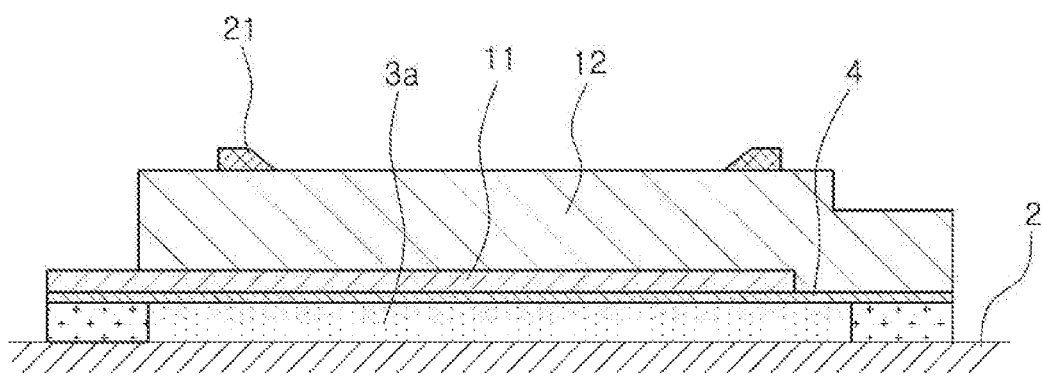

The operation of forming the internal frame 21 is illustrated in FIG. 5. In this example, in an operation of forming the frame portion 20, the internal frame 21 is formed by depositing a material to form the internal frame 21 on the piezoelectric layer 12.

As such, the internal frame 21 is formed in a protruding shape on the piezoelectric layer 12, and is formed of the same material as that of the second electrode 13 or a dielectric material.

The operation of forming the internal frame 21 is performed using a required pattern obtained by performing a photolithography process after a material for the formation of the internal frame 21 is deposited on the piezoelectric layer.

As an example, the operation of forming the internal frame 21 includes forming the internal frame 21 to include at least one inclined surface, or forming the internal frame 21 of which an upper surface and a side surface are perpendicular to each other, such that the internal frame 21 excludes an inclined surface.

The operation of forming the second electrode 13 and the external frame 22 includes forming the second electrode 13 and the external frame 22 on the piezoelectric layer 12. The external frame 22 is formed in such a manner that the internal frame 21 is embedded therein.

Thus, the external frame 22 is formed to include at least three reflective portions 20a, 20b and 20c having different thicknesses to reflect lateral waves. Because the external frame 22 is formed together with the second electrode 13 through a deposition process and an etching process, the external frame 22 is formed of the same material as that of the second electrode 13, and is formed continuously with an edge portion of the second electrode 13.

Figure 6:
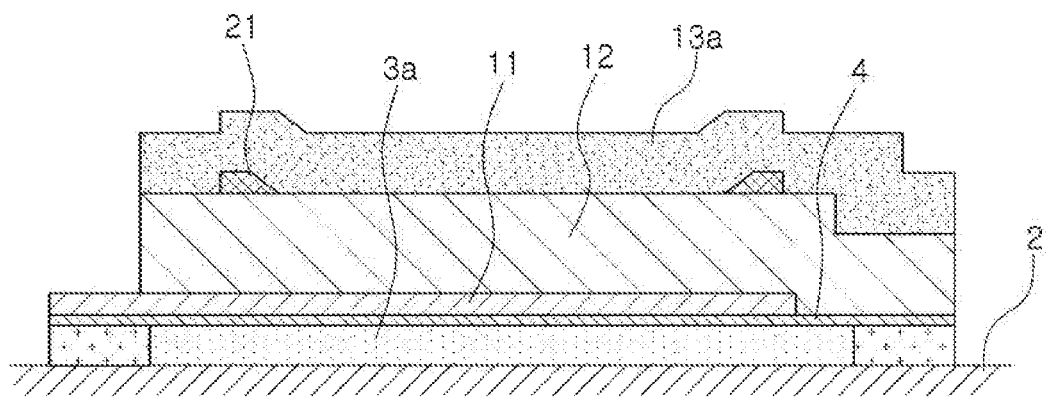
Figure 7:
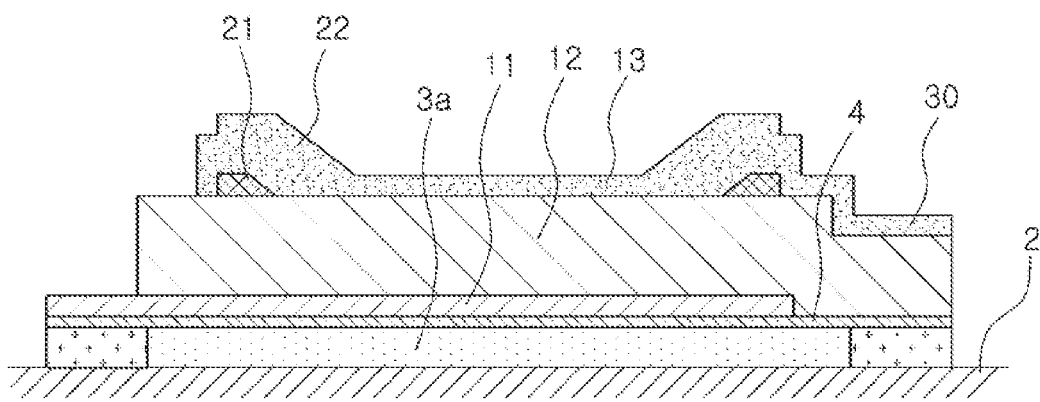

Referring to FIG. 6 and FIG. 7, the second electrode 13 is formed by forming the conductive layer 13a on the piezoelectric layer 12 and the first electrode 11, subsequently patterning the conductive layer 13a through a photolithography process, and then performing etching to obtain a required pattern by using a resist as a mask.

The second electrode 13 described above may be formed using a variety of metals, such as ruthenium (Ru), gold, molybdenum, aluminum, platinum, titanium, tungsten, palladium, chromium, nickel, iridium, or the like.

As an example, the external frame 22 is provided as an unetched portion when the etching process is performed to form the second electrode 13, and has a thickness greater than a thickness of the second electrode 13.

As such, the operation of forming the second electrode 13 and the external frame 22 includes forming the conductive layer 13a having a uniform thickness, on an upper region of the piezoelectric layer 12, including a region in which the internal frame 21 is formed, and partially etching the conductive layer 13a to form the second electrode 13 having a thickness less than a thickness of the external frame 22.

In this example, the operation of forming the conductive layer 13a is illustrated in FIG. 6, and the operation of forming the second electrode 13 having a thickness less than that of the external frame 22 is illustrated in FIG. 7.

In the operation of forming the second electrode 13 having a thickness less than that of the external frame 22, the conductive layer 13a is etched to have a form of the second electrode 13, and simultaneously therewith, a connection electrode 30 is also formed via etching.

For example, the connection electrode 30 is formed to have a thickness less than a thickness of the external frame 22 via etching to prevent deteriorations in symmetry properties of the external frame 22.

After the connection electrode 30 is formed, connection portions to transmit and receive an electrical signal are formed.

The connection portions are formed by removing portions of the protective layer 5 by etching to form holes to externally expose the connection electrode 30 connected to the first electrode 11 or the second electrode 13, and depositing gold (Au), copper (Cu) or the like therein.

As another example, the external frame 22 is also formed by a primary conductive layer 22a formed in a periphery region of the internal frame 21, and a secondary conductive layer 22b formed continuously with the second electrode 13 and formed up to a region corresponding to the region of the internal frame 21.

Figure 9:
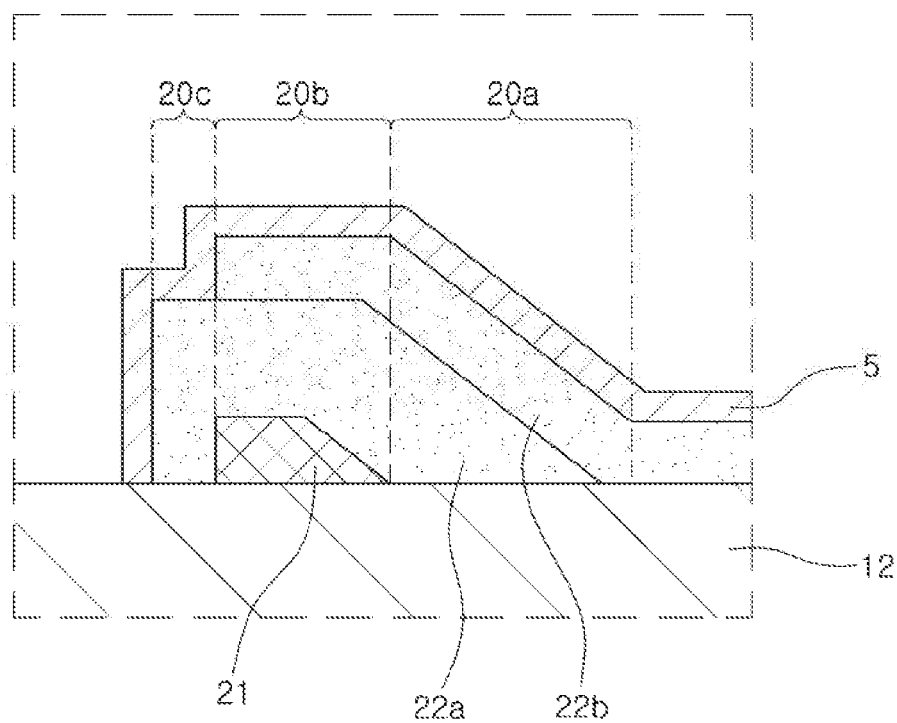
FIG. 9 illustrates a modified example of an operation of forming a second electrode and an external frame in a method of manufacturing an acoustic resonator, according to an example.

In other words, as illustrated in FIG. 9, the operation of forming the second electrode 13 and the external frame 22 includes forming a primary conductive layer 22a above the piezoelectric layer 12 on which the internal frame 21 is formed to allow the internal frame 21 to be embedded therein, and forming the secondary conductive layer 22b having a uniform thickness on a region of the piezoelectric layer 12, including the region in which the primary conductive layer 22a is formed.

Figure 8:
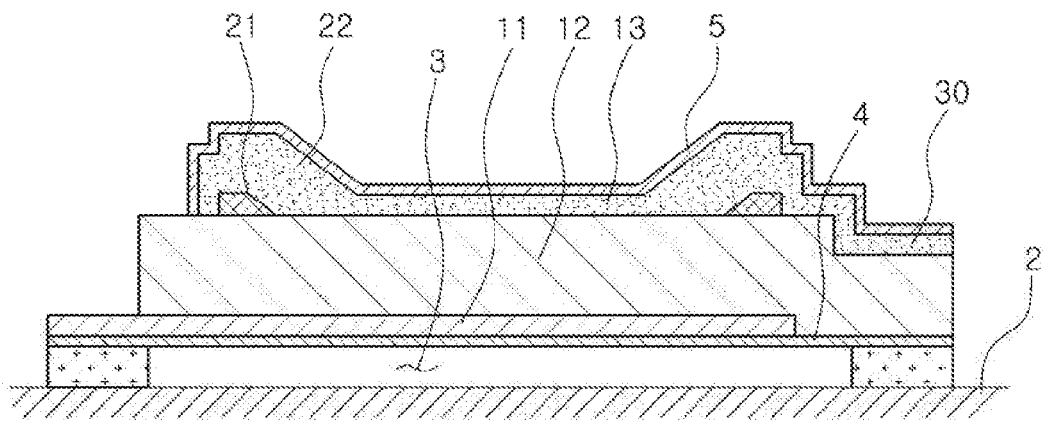

As illustrated in FIG. 8, the protective layer 5 is formed on the second electrode 13 and the external frame 22.

In this example, the protective layer 5 is formed of an insulating material, and examples of the insulating material include a silicon oxide-based material, a silicon nitride-based material, and an aluminum nitride-based material.

Referring to FIG. 8, the resonant portion 10 improves reflection characteristics of acoustic waves by forming the air gap 3 therein. In other words, because the air gap 3 is an empty space and has impedance close to infinity, acoustic waves remain in the resonant portion 10 without loss thereof by the air gap 3.

To this end, the sacrificial layer 3a formed between the substrate 2 and the first electrode 11 or the membrane layer is removed. The sacrificial layer 3a is removed by dry etching, but is not limited thereto.

For example, when the sacrificial layer 3a is formed of polysilicon, the sacrificial layer 3a is removed using dry etching gas such as xenon difluoride ($XeF_2$) or the like.

As set forth above, in an acoustic resonator, according to examples, lateral waves generated in a resonant portion may be reflected at least three times, whereby external discharge and loss of the generated lateral waves may be decreased.

Further, in the case of an acoustic resonator, according to an example, generation of parasitic capacitance due to a frame portion may be reduced. As an example, when the internal frame 21 is formed of a dielectric material, parasitic capacitance may be reduced, as compared with a case in which a frame is only formed of a metal.

While this disclosure includes specific examples, it will be apparent after understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator, comprising:
   a resonant portion comprising a piezoelectric layer disposed between a first electrode and a second electrode; and
   a frame portion disposed along an outer edge of the second electrode,
   wherein the frame portion comprises:
      reflective portions configured to reflect lateral waves generated in the resonant portion;
      an internal frame spaced apart from the second electrode and disposed on the piezoelectric layer along an outer edge of the second electrode; and
      an external frame continuously disposed with the second electrode, and disposed on the piezoelectric layer to embed the internal frame in the external frame.

2. The acoustic resonator of claim 1, wherein the external frame is formed of a same material as a material of an edge portion of the second electrode, and is continuously formed with the edge portion of the second electrode.

3. The acoustic resonator of claim 1, wherein the external frame has a thickness greater than a thickness of the second electrode.

4. The acoustic resonator of claim 1, wherein the external frame comprises an inclined surface.

5. The acoustic resonator of claim 1, wherein the internal frame is formed of a dielectric material.

6. The acoustic resonator of claim 1, wherein the internal frame is formed of a same material as a material of the external frame.

7. The acoustic resonator of claim 1, further comprising:
   a protective layer disposed on the second electrode and the frame portion.

8. The acoustic resonator of claim 1, further comprising:
   a connection electrode comprising one end connected to the second electrode via the frame portion and another end connected to an external electrode, the connection electrode having a thickness less than a thickness of the frame portion.

9. The acoustic resonator of claim 1, further comprising:
   a connection electrode, wherein the first electrode and the second electrode are connected to a portion of the connection electrode that extends outwardly of the piezoelectric layer, to be connected to a connection part and an external electrode.

10. The acoustic resonator of claim 1, wherein the reflective portions are configured as regions having different thicknesses or as regions having different lamination structures or material composition.

11. The acoustic resonator of claim 1, wherein the reflective portions comprise three reflective portions, and wherein a first reflective portion of the three reflective portions closest to the second electrode and a third reflective portion of the three reflective portions farthest from the second electrode are formed to have a same lamination structure and a same thickness as each other.

12. The acoustic resonator of claim 1, wherein a second reflective portion of the reflective portions disposed between a first reflective portion of the reflective portions and a third reflective portion of the reflective portions comprises a lamination structure and a thickness different from lamination structures and thicknesses of the first reflective portion and the third reflective portion.

* * * * *